United States Patent

Wuu et al.

[11] Patent Number: 6,117,722
[45] Date of Patent: Sep. 12, 2000

[54] SRAM LAYOUT FOR RELAXING MECHANICAL STRESS IN SHALLOW TRENCH ISOLATION TECHNOLOGY AND METHOD OF MANUFACTURE THEREOF

[75] Inventors: Shou-Gwo Wuu, Chu-Tong; Jin-Yuan Lee, Hsin-Chu; Dun-Nian Yaung, Taipei; Jeng-Han Lee, Kinmen, all of Taiwan

[73] Assignee: Taiwan Semiconductor Manufacturing Company, Hsin-Chu, Taiwan

[21] Appl. No.: 09/252,464

[22] Filed: Feb. 18, 1999

[51] Int. Cl.[7] .................................. H01L 21/8234
[52] U.S. Cl. ..................... 438/238; 438/296; 257/776
[58] Field of Search ........................ 438/296, 238; 257/776

[56] References Cited

U.S. PATENT DOCUMENTS

| | | | |
|---|---|---|---|
| 5,466,632 | 11/1995 | Lur et al. | 437/69 |
| 5,914,504 | 6/1999 | Augusto | 257/192 |
| 5,977,558 | 11/1999 | Lee | 257/48 |
| 6,043,562 | 3/2000 | Keeth | 257/776 |

*Primary Examiner*—Charles Bowers
*Assistant Examiner*—David S Blum
*Attorney, Agent, or Firm*—George O. Saile; Stephen B. Ackerman; Graham S. Jones, II

[57] ABSTRACT

An SRAM device has STI regions separated by mesas and doped regions including source/drain regions, active areas, wordline conductors and contacts in a semiconductor substrate is made with a source region has 90° transitions in critical locations. Form a dielectric layer above the active areas. Form the wordline conductors above the active areas transverse to the active areas. The source and drain regions of a pass gate transistor are on the opposite sides of a wordline conductor. Form the sidewalls along the <100> crystal plane. Form the contacts extending down through the dielectric layer to the mesas. Substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

12 Claims, 5 Drawing Sheets

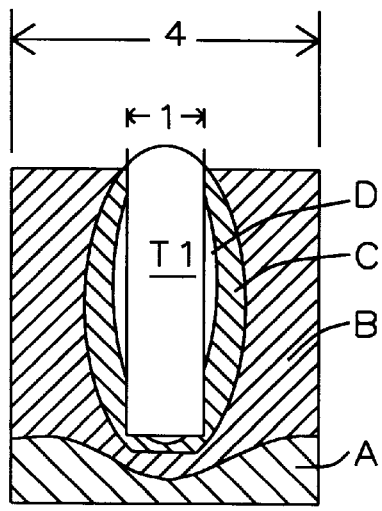
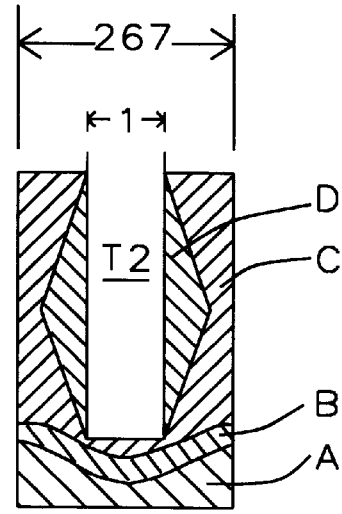
FIG. 5A    FIG. 5B
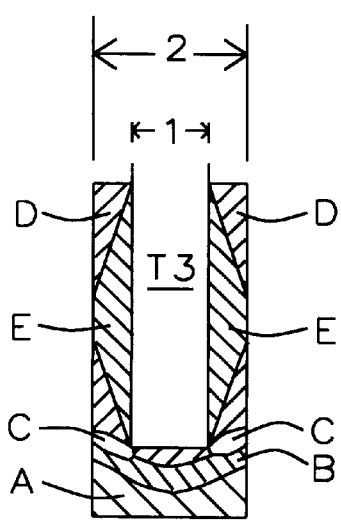
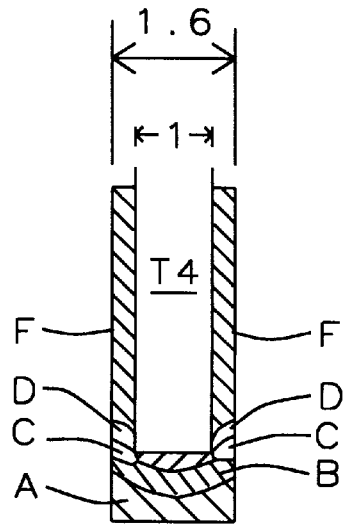
FIG. 5C    FIG. 5D

SRAM LAYOUT FOR RELAXING MECHANICAL STRESS IN SHALLOW TRENCH ISOLATION TECHNOLOGY AND METHOD OF MANUFACTURE THEREOF

BACKGROUND OF THE INVENTION

1. Field of the Invention

This invention relates to semiconductor memory devices and more particularly to the configuration of SRAM memory devices.

2. Description of Related Art

Mechanical stress has been a problem which has existed in Shallow Trench Isolation (STI) technology. Mechanical stress tends to induce crystal defects which will result in creating leakage paths. It is necessary that such leakage paths should be suppressed to improve yield.

In U.S. Pat. No. 5,466,632 of Lur et al. a FOX region with curvilinear boundaries is employed to reduce stress.

SUMMARY OF THE INVENTION

In accordance with this invention, 90 degree transitions are employed at critical locations, while using 45 degree transition as few times as possible, where STI technology is used in an SRAM layout.

Problems which are solved by the present invention are as follows:
1. Leakage is decreased by reduction of crystal defects.
2. Large contact (CO)/active area (AA) extension reduces the difficulties associated with photolithographic misalignment.
3. The contact etch window is increased because no stop layer (such as a silicon nitride stop layer) is required to be employed.

In accordance with this invention, a method of forming a layout for an SRAM device is provided having doped regions including a source region, a drain region, and active areas, a wordline conductor and contacts. First form a layout of at least one source/drain region in a doped semiconductor substrate with 90° transitions in critical locations where a source/drain region is to be formed; form a dielectric layer above the active areas; form the wordline conductor above the active areas transverse to the active areas, and form source regions in the critical locations in the active areas juxtaposed with the wordline conductor to form pass gate transistors while simultaneously forming drain regions in the active areas juxtaposed with the wordline conductor on the opposite side from the source regions to form pass gate transistors, forming the sidewalls along the <100> crystal plane. Then, form the contacts to the source/drain regions formed between the wordline conductor extending down through to the dielectric layer to the source/drain regions. Substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

In accordance with another aspect of this invention, an SRAM device with a preferred layout having source regions, drain regions, active areas, a wordline conductor and contacts. Regions are formed in a doped silicon semiconductor substrate with 90° transitions in critical locations where source regions are to be formed. A dielectric layer is formed above the active areas. The wordline conductor is composed of doped polysilicon formed above the active areas transverse to the active areas. Source regions are formed in the critical locations in the active areas juxtaposed with the wordline conductor to form pass gate transistors while simultaneously formed drain regions in the active areas juxtaposed with the wordline conductor on the opposite side from the source regions to form pass gate transistors. The source region sidewalls are formed along the <100> crystal plane. The contacts to the drain regions formed between the wordline conductor extending down through to the dielectric layer to the drain regions. The source regions and the drain regions have similar sizes and shapes. Once again, substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

BRIEF DESCRIPTION OF THE DRAWINGS

The foregoing and other aspects and advantages of this invention are explained and described below with reference to the accompanying drawings, in which:

FIGS. 5A–5D show the shear stress distribution when trench space width is narrowed while keeping line width constant.

DESCRIPTION OF AN EMBODIMENT WITH <110> PLANE MECHANICAL STRESS

Figure 1A:
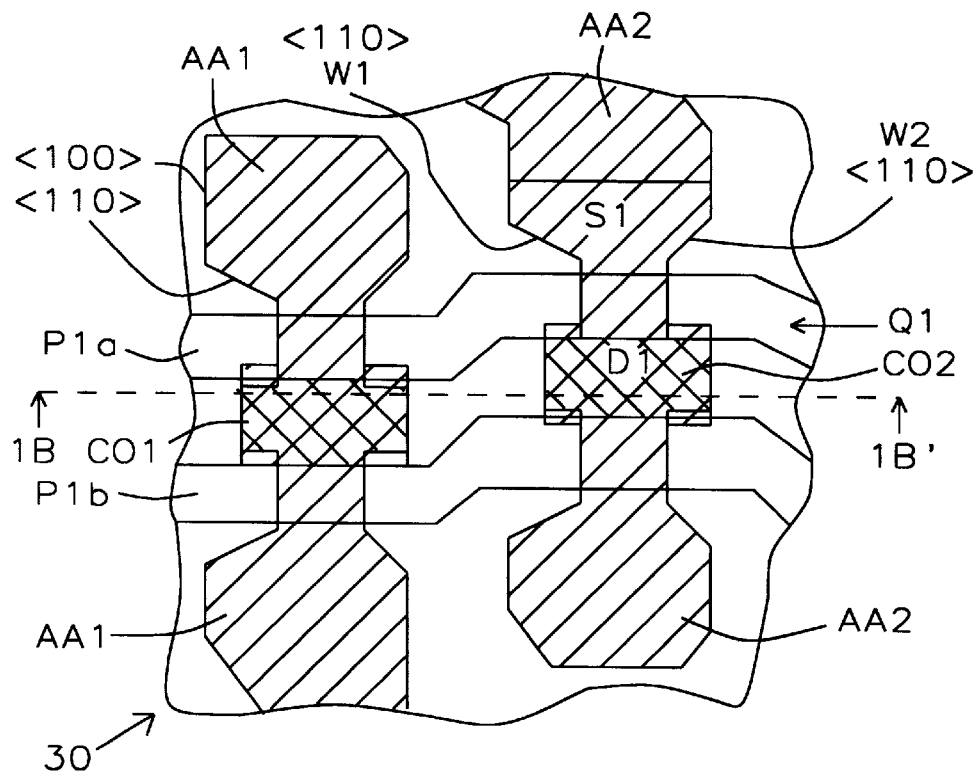
FIG. 1A shows a plan view of a portion of a first design considered for an SRAM design layout.
Figure 1B:
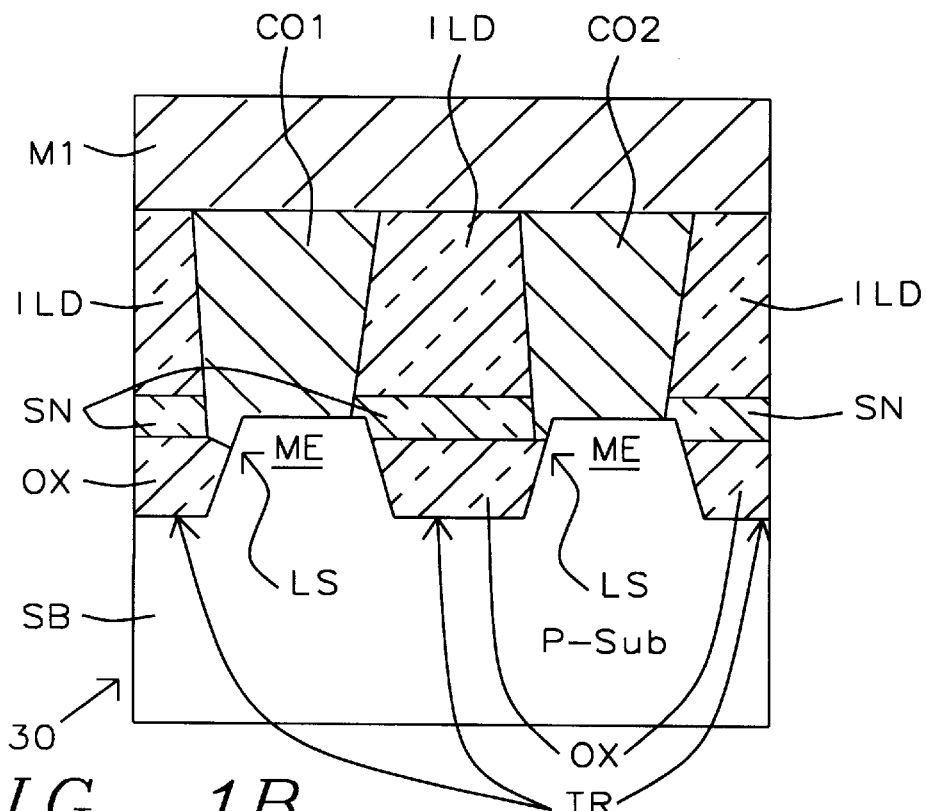
FIG. 1B shows a sectional, elevational view taken along line 1B–1B' in FIG. 1A.

FIG. 1A shows a plan view of a portion of a first design considered for use as an SRAM design layout which has been found to have a problem of leakage paths. FIG. 1B shows a sectional, elevational view taken along line 1B–1B' in FIG. 1A. The device 30 which includes an SRAM is formed on a P– doped silicon substrate SB.

Referring to FIG. 1A the device 30 includes two vertically extending active areas AA1/AA2, two horizontally extending word lines P1a and P1b composed of a conventional polysilicon 1 metallization layer. Word lines P1a and P1b include the gate electrodes of pass gate transistors Q1 and Q2 in FIG. 3. The contacts CO1 and CO2 are located between the word lines P1a and P1b extending down to active areas AA1/AA2 respectively. Source region S1 and drain region D1 (formed in P− doped silicon substrate SB) are shown above and below the word line P1a in FIG. 1A in the active area AA2. The drain region D1 is square and the source region S1 is smaller and has 45° diagonal walls W1 and W2 diverging away to a wider active area AA2 on the top of FIG. 1A which are formed along the <110> oriented plane in the silicon substrate 32.

Referring to FIG. 1B, a plurality of trenches TR and mesas ME have been formed in the surface of the P− doped silicon semiconductor substrate SB. The trenches TR have been filled with silicon dioxide STI regions OX. Between the trenches TR are two separate mesas ME of P− substrate SB formed during the formation of the adjacent trenches. The mesas ME serve as contact regions for the contacts CO1 and CO2 which are superjacent to and in contact with the tops of mesas ME.

Processing for Device of FIGS. 1A and 1B
1.1 Substrate with STI Regions between Mesas A process of forming the device of FIGS. 1A and 1B involves starting with the P− substrate SB filled with silicon dioxide STI regions OX with mesas ME therebetween.

1.2 Silicon Nitride Layer

Next, a blanket silicon nitride layer SN was formed over the mesas ME and partly over the STI regions OX.

1.3 ILD Layer

Next, a blanket InterLayer Dielectric (ILD) glass layer ILD was formed covering the silicon nitride layer SN.

1.4 Contact Openings Over Mesas

In the next step in the manufacturing process to produce the devices shown in FIGS. 1A and 1B, contact openings are etched through the glass layer ILD. Although the contact openings were intended to be centered over the mesas ME between the STI regions OX, and despite attempts to center the contact openings over the mesas ME between the STI regions OX, as shown by FIG. 1B, the openings are substantially off-center with respect to the mesas ME as indicated by the location of contacts CO1 and CO2 in FIG. 1B. Since the contact holes are off-center with respect to the mesas ME in FIG. 1B, the sidewalls of the mesas ME were partially exposed (which exposes the <110> oriented plane to contacts CO1 and CO2 as described next).

1.5 Contacts Made to Mesas

Next, for producing the devices shown in FIGS. 1A and 1B, conventional contact metallization was deposited into the contact openings formed during step 1.4 to form the contacts CO1 and CO2 deposited in the contact openings. As a result the two mesas ME are connected mechanically and electrically to contacts CO1 and CO2.

There is a problem that the alignment of the contact holes formed during step 1.4 in the process of FIGS. 1A and 1B, leaves the thin silicon nitride layers SN above the STI oxide regions OX misaligned with the mesas ME. As seen in FIG. 1B, the contact holes expose the upper left edges of the mesas ME (substrate SB) exposed which form "rounded" surfaces of the mesas ME (substrate SB) on which contacts CO1 and CO2 are formed. We have found that the "rounded" surfaces of the mesa ME (substrate SB) are a problem, exposing the <110> oriented plane of the substrate SB thereby producing leakage sources LS seen in FIG. 1B in response to stress generated at the <110> oriented planes. That stress at the leakage sources LS forms leakage paths from the contacts CO1 and CO2 passing through the mesas ME (substrate SB) where the <110> oriented plane surfaces of the substrate are exposed.

To eliminate leakage paths and leakage sources LS, we have found that the exposure of the surfaces of the <110> oriented planes adjacent to the mesas ME should be minimized to minimize production of stress in the mesas ME. Moreover, we have found that orthogonal lines formed along the <100> oriented plane are more easily reproduced by photolithography. Also, it is easier to reproduce straight lines than to reproduce lines which are a combination of vertical, horizontal and diagonal lines that introduce surfaces of substrate SB with a <110> oriented plane exposed to the contacts CO1 and CO2.

In addition, after the active region photolithography and etching, the D1 region of device 30 as shown in FIG. 1A and 1B is "rounded" and much smaller than the original layout.

DESCRIPTION OF THE PREFERRED EMBODIMENT

Figure 2A:
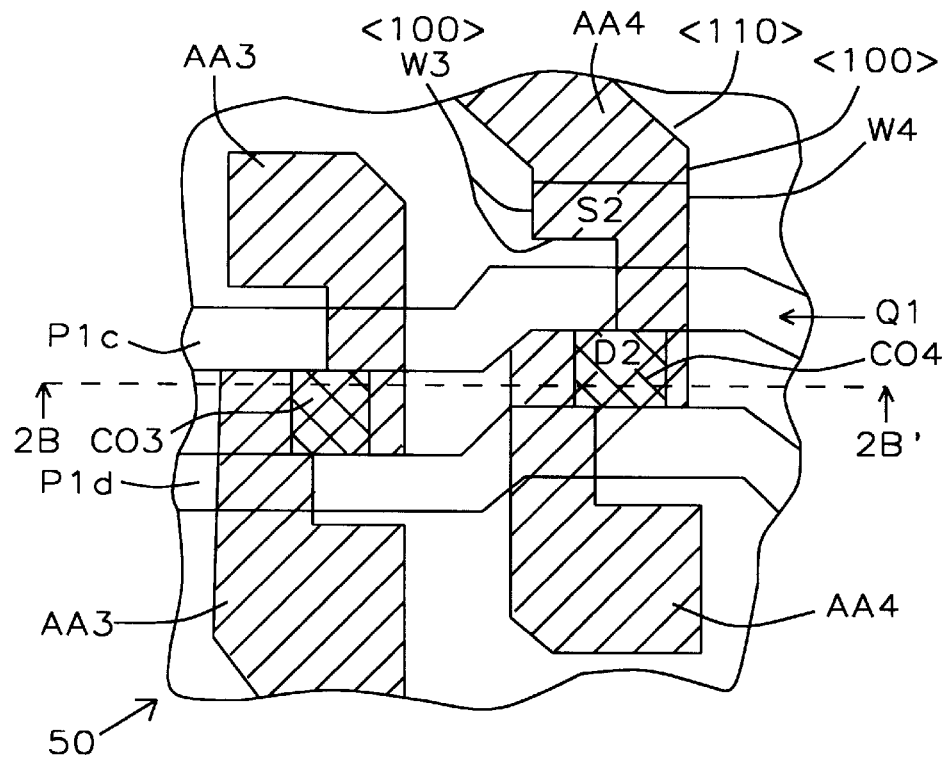
FIG. 2A shows a plan view of a portion of a first design considered for an SRAM design layout in accordance with this invention.
Figure 2B:
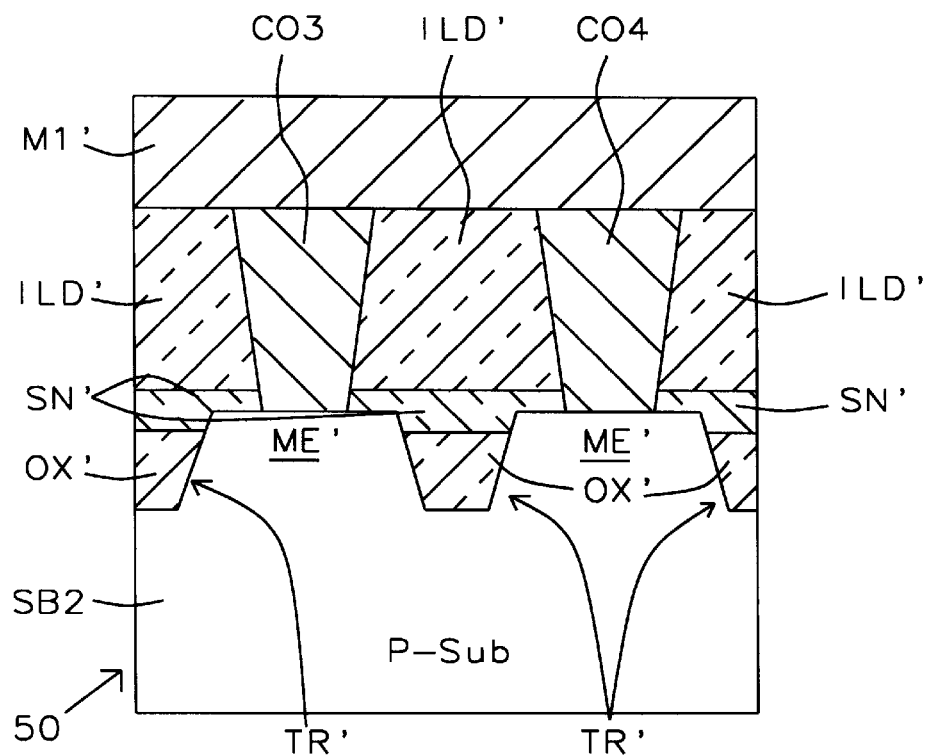
FIG. 2B shows a sectional, elevational view taken along line 2B–2B' in FIG. 2A.

FIG. 2A shows a plan view of a portion of a first design considered for an SRAM design layout in accordance with this invention which is a modification of the design shown in FIG. 1A. FIG. 2B shows a sectional, elevational view taken along line 2B–2B' in FIG. 2A. The device 50 which includes an SRAM is formed on a P− doped silicon substrate SB'.

Referring to FIG. 2A, there a series of 90° transitions is employed in the profile of the active area at critical locations W3/W4, such as the sidewalls of the source regions of the pass gate transistors Q1/Q2. The set of 90° transitions maximizes the <100> oriented planes and minimizes the <110> oriented plane along the sidewalls of the regions, where such criticality exists. This contrasts with FIG. 1A with the 45° diagonal walls W1 and W2 diverging away to a wider active area AA2.

Referring to FIG. 2A the device 50 includes two active areas AA3/AA4, which extend vertically; two horizontally extending word lines P1c and P1d (formed of polysilicon 1 metallization). Word lines P1c and P1d serve as the gate electrodes of pass gate transistors Q1 and Q2 in FIG. 3. Contacts CO3 and CO4 are located between word lines P1c and P1d extending down to the active areas AA3/AA4 respectively. Source region S2 and drain region D2 (formed in P− doped silicon substrate SB2) are shown above and below the word lines P1c in FIG. 2A in the active area AA4. The drain region D21 is square and the source region S2 is also square. The orthogonal walls W3 and W4 in FIG. 2A are formed along <100> oriented planes in the silicon substrate SB2, as contrasted with the 45° diagonal walls W1 and W2 of FIG. 1A.

Referring to FIG. 2B, a plurality of trenches TR' have been formed in the surface of P− doped silicon semiconductor substrate SB2. The trenches TR' have been filled with silicon dioxide STI regions OX'. Between the trenches TR' are two separate mesas ME' of the P− substrate SB2 formed as the result of forming the adjacent trenches TR'. Mesas ME' serve as contact regions for the contacts CO3 and CO4 which are formed superjacent to the mesas ME', i.e. on the top surfaces of mesas ME'. From a different point of view, the silicon dioxide STI regions OX' separate the mesas ME' of the substrate SB2.

Processing for Device of FIGS. 2A and 2B
2.1 Substrate with STI Regions Between Mesas A process of forming the device of FIGS. 2A and 2B involves starting with the P− substrate SB2 filled with silicon dioxide STI regions OX' with mesas ME' therebetween. The STI regions OX' are formed in a conventional manner.

2.2 Silicon Nitride Layer

After the STI regions OX' and mesas ME' were formed the substrate SB2, a blanket silicon nitride layer SN' was formed covering the mesas ME' and the STI regions OX'. The silicon nitride layer SN' was formed by LPCVD or PECVD to a thickness between about 600 Å and 1,000 Å.

2.3 ILD Layer

Next, a blanket InterLayer Dielectric (ILD) glass layer ILD' was formed covering the silicon nitride layer SN'. The InterLayer Dielectric (ILD) glass layer ILD' is composed of undoped plasma enhanced TEOS (PETEOS) silicon dioxide. The glass layer ILD' is deposited to a thickness between 1000 Å and 2000 Å using tetraethylorthosilicate (TEOS) as a source followed by an overlying layer of BPSG (BoroPhosphoSilicate Glass) deposited to a thickness between 3,000 Å and 12,000 Å. Then, the glass layer ILD is annealed.

2.4 Contact Openings Over Mesas

In the next step in the manufacturing process for producing the devices shown in FIGS. 2A and 2B, contact openings are etched through the glass layer ILD'.

First a conventional type of photoresist mask (not shown) is formed and contact openings through the glass layer ILD' are etched through openings in the mask. (The openings in the mask extend down to top surface of the glass layer ILD').

Then contact openings are etched through the layer ILD'. The contact openings are well centered over the mesas ME' between the STI' regions OX', as shown by FIG. 2B with substantial margins to the left and to the right. The on-center openings are indicated by the location of contacts CO3 and CO4 in FIG. 2B on the centers of the top surfaces of the mesas ME'. Since the contact holes are on-center with respect to the mesas ME' in FIG. 2B, the sidewalls of the mesas ME' are protected (which protects the <110> oriented plane from contacts CO3 and CO4, as described next).

During processing, the contact openings are etched through the mask and through the layer ILD' by an etching method using an anisotropic, dry RIE process using $CHF_3$ gas as an etchant.

The openings etched through the layer ILD' are centered over the mesas ME' between the STI regions OX', unlike the openings in FIG. 1A.

Above the STI oxide regions OX', the contact openings through the thin silicon nitride layers SN' are aligned with and overlapping the surfaces of the mesas ME' leaving the upper edges of the mesas ME' protected from exposure of "rounded" surfaces of the substrate SB2 to the contacts CO3 and CO4.

2.5 Contacts Made to Mesas

Next, for producing the devices shown in FIGS. 2A and 2B, conventional contact metallization was deposited into the contact openings formed during step 2.4 to form the contacts CO3 and CO4 deposited in the contact openings. As a result the two mesas ME' are connected mechanically and electrically to contacts CO3 and CO4.

The layout of STI regions OX' is located along the <100> silicon (Si) plane. This eliminates what would be a potential cause of formation of leakage sources from the contacts CO3 and CO4. In other words the <110> oriented plane surfaces of the mesas ME' of substrate SB' are protected from exposure to the contacts CO3 and CO4 thereby eliminating a possible cause of a leakage problem.

Circuit & Cell Layout

Figure 3:
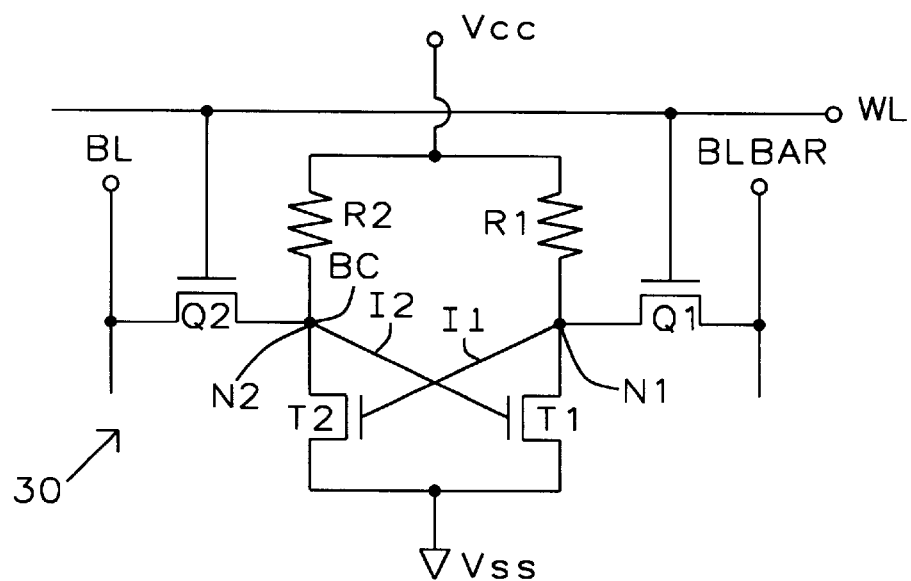
FIG. 3 shows a electrical schematic circuit diagram of an SRAM device of FIGS. 1A, 1B, 2A and 2B showing a cell layout for the SRAM circuit in accordance with the embodiment of this invention found in FIGS. 2A and 2B.

FIG. 3 shows a electrical schematic circuit diagram of an SRAM device of FIGS. 1A, 1B, 2A and 2B which shows the cell layout for the SRAM circuit in accordance with this invention. In FIG. 3, a voltage Vcc is connected to the top ends of pull up resistors R1/R2 which have been formed from the third polysilicon conductor layer P3, where the dopant levels are lower. The bottom end of the right pull up resistor R1 is connected to node N1 which is connected through the drain/source circuit of FET pull down FET transistor device T1 to ground potential Vss. The bit line BLBAR is connected through the source/drain circuit of FET, pass transistor device Q1 to node N1. Node N1 connects to the common drains of transistors T1 and Q1.

The bottom end of the left pull up resistor R2 is connected to node N2/BC which is connected through to the drain/source circuit of pull down FET transistor device T2 to ground potential Vss. The bit line BL is connected through the source/drain circuit of FET, pass transistor device Q2 to node N2/BC. Node N2 connects to the common drains of transistors T2 and Q2 and the butted contact BC.

The word line (row select) is formed form the first polysilicon layer PS1 and is connected to the gate electrodes of the pass transistors Q1/Q2. The node N1 is connected via interconnect line I1 to the gate electrode of pull down transistor T2. The node N2 is connected via interconnect line I2 to the gate electrode of pull down transistor T1. Ground potential Vss is connected to devices formed from the M1, CT, polysilicon 2 layer, and the SAC. The power supply potential Vcc is connected to devices formed from the M1, polysilicon 1 layer and polysilicon 3 layer. The location of transistors Q1 is seen in the plan view of the devices 30/50 seen in FIGS. 1A/2A.

Figure 4A:
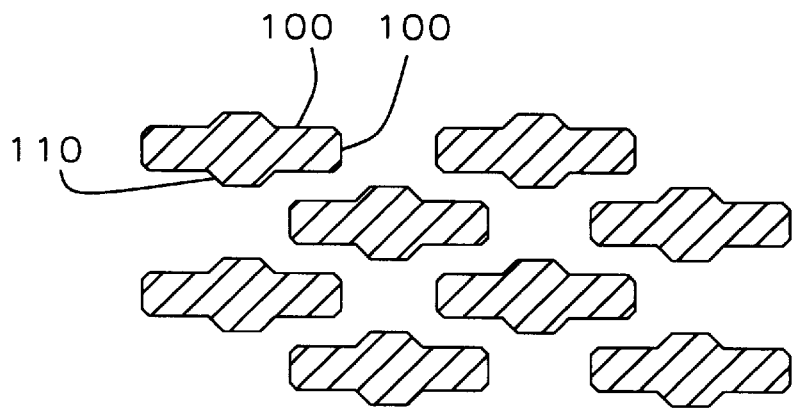
FIGS. 4A and 4B show two types of STI patterns. The Shallow Trench Isolation (STI) regions are unshaded, and the DRAM cell region is shown as the dashed box in FIG. 4B.
Figure 4B:
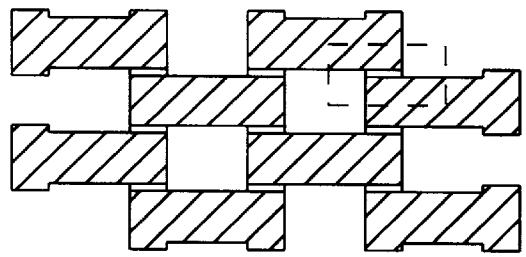

FIGS. 4A and 4B show two types of STI (Shallow Trench Isolation) patterns. Patterns in FIGS. 4A and 4B are referred below as type A and type B patterns, respectively. The shallow trench regions are unshaded, and the DRAM cell region is shown as the dashed box in FIG. 4B. Note that the oxidation rate on the <100> plane is faster than along the <110> plane.

FIGS. 5A–5D show the shear stress distribution when trench space width is narrowed while keeping line width constant. There are regions of varying stress distribution shown in FIGS. 5A–5D. Regions A are those areas in which the shear stress ranges between $0–5 \times 10^8$ dynes/cm$^2$. Regions A–F are provided as indicated by the shading in FIGS. 5A–5D.

An overall table of shear stress regions A–F is as follows:

| SHEAR STRESS REGIONS | |
|---|---|
| A | $0.0–5.0 \times 10^8$ dynes/cm$^2$ |
| B | $5.0–10.0 \times 10^8$ dynes/cm$^2$ |
| C | $10.0–15.0 \times 10^8$ dynes/cm$^2$ |
| D | $15.0–20.0 \times 10^8$ dynes/cm$^2$ |
| E | $20.0–25.0 \times 10^8$ dynes/cm$^2$ |
| F | $25.0–30.0 \times 10^8$ dynes/cm$^2$ |

FIG. 5A shows an arrangement with a line width of about 1 μm with lateral space of about 3 μm on either side of the trench T1 for an overall width of about 4 μm. The stress is in range A at the base, B at the periphery of the sides, rising to C/D along the sidewalls of the trench T1.

FIG. 5B shows an arrangement with a line width of about 1 μm with lateral space of about 1.67 μm on either side of the trench T2 for an overall width of about 2.67 μm. The stress is in ranges A/B at the base, C/D at the periphery of the sides along the sidewalls of the trench T2.

FIG. 5C shows an arrangement with a line width of about 1 μm with lateral space of about 1 μm on the sides of the trench T3 for an overall width of about 2 μm. The stress is in ranges A and B at the base, C at the base of the sides and D and E at the sidewalls of the trench T3.

FIG. 5D shows an arrangement with a line width of about 1 μm with lateral space of about 0.6 μm on either side of the trench T4 for an overall width of about 2.6 μm. The stress is in ranges A, B and C at the base, D at the base of the sides and F along the sidewalls of the trench T4. The dark sectioning indicates the very much large space stress in the range from about 25–30 over almost the entire area shown for this very narrow space.

Figure 6:
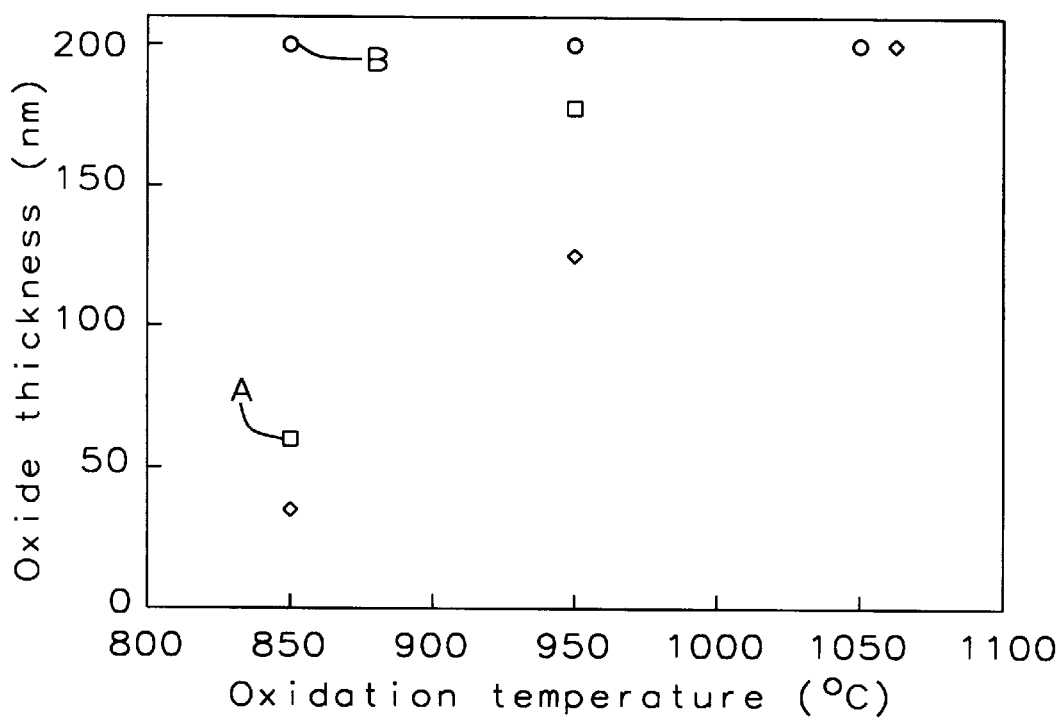
FIG. 6 is a chart of oxide thickness as a function of oxidation temperature illustrating the effect of pattern type on defect formation for various oxidation temperatures. The open circles correspond to data from FIG. 4B; the solid circles and squares correspond to data from FIG. 4A. Both sets of circles indicate that no defects were observed, while the squares indicate that multiple defects were observed in all cells.

FIG. 6 shows the oxide thickness (0 nm to 150 nm) as a function of oxidation temperature (800° C. to 1100° C.). The effect of pattern type on defect formation for various oxidation temperatures. The open circles correspond to data from Pattern B in FIG. 4B; the solid circles and squares correspond to data from Pattern A in FIG. 4A. Both sets of circles indicate that no defects were observed, while the squares indicate that multiple defects were observed in all cells. Note that the 200 nm thickness is the thickness at which oxide leads to crystal defects. The pattern in FIG. 4B has a higher immunity to crystal defect formation.

Figure 7A:
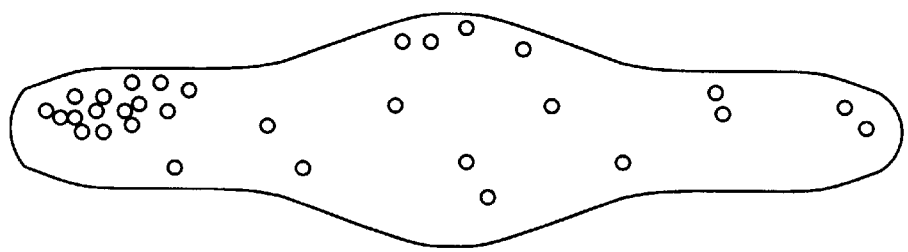
FIGS. 7A and 7B show the bright field, plan view transmission electron microscope of the silicon mesa pattern in FIG. 4A.
Figure 7B:
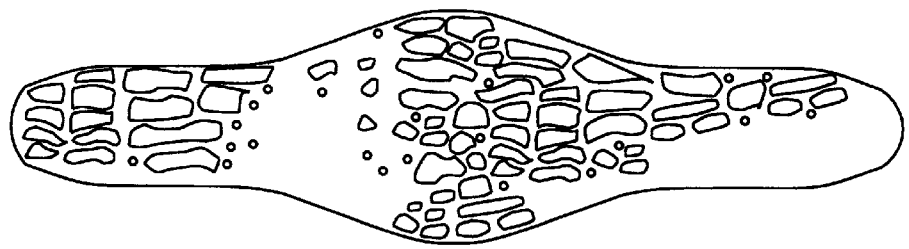

FIGS. 7A and 7B show the bright field, plan view transmission electron microscope of silicon mesa pattern type A in FIG. 4A. Samples were oxidized at 850° C. The results were as follows:
(a) No dislocations were present after forming of 38 nm of oxide.
(b) Increasing the oxidation time to grow 56 nm of oxide resulted in multiple dislocations throughout the mesa.

SUMMARY

In accordance with this invention, features of this invention are as follows:
1. The STI layout is located along the <100> silicon (Si) plane.
2. This layout shows high fidelity photolithography. The mask layout can be reproduced on a wafer with a low-encroachment effect.
3. The pass gate transistor has good symmetry in that the source region and the drain region areas are similar in size and shape as seen in the plan view, FIG. 2A.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a layout for an SRAM device having a doped semiconductor substrate with STI trench regions in said substrate filled with an isolation material and source and drain regions, a wordline conductor, active areas, and contacts formed in said substrate comprising:
  forming a layout of at least one source/drain region, in said semiconductor substrate with 90° transitions in critical locations of said active areas of said device,
  forming a dielectric layer above said active areas,
  forming said source/drain region in said substrate juxtaposed with said wordline conductor, and
  forming said contacts to said source region and said drain region extending down through said dielectric layer to said substrate regions,
  whereby stress is reduced because of a larger active area region and the reduction of the probability of substrate defects has been decreased.

2. A method in accordance with claim 1 wherein:
said source region sidewalls are formed along the <100> crystal plane.
3. A method in accordance with claim 1 wherein:
said wordline conductor is formed of doped polysilicon.
4. A method in accordance with claim 1 wherein:
said source region sidewalls are formed along the <100> crystal plane, and
said wordline conductor is formed of doped polysilicon.
5. A method in accordance with claim 1 wherein:
said semiconductor substrate comprises silicon.
6. A method in accordance with claim 1 wherein:
said semiconductor substrate comprises silicon,
said source region sidewalls are formed along the <100> crystal plane, and
said wordline conductor is formed of doped polysilicon.
7. A method of forming a layout for an SRAM device having a doped semiconductor substrate with STI trench isolation regions in said substrate filled with STI isolation material, source regions, drain regions, active areas, a wordline conductor and contacts comprising:
  forming said active areas in a doped semiconductor substrate with 90° transitions in critical locations,
  forming a dielectric layer above said active areas,
  forming said wordline conductor polysilicon above said active areas transverse to said active areas,
  forming source regions in said active areas juxtaposed with said wordline conductor to form pass gate transistors while simultaneously forming drain regions in said active areas juxtaposed with said wordline conductor on the opposite side from said source regions to form pass gate transistors,
  said source region sidewalls being formed along the <100> crystal plane,
  forming said contacts to said drain regions between said wordline conductor extending down through said dielectric layer to said drain regions, and
  said source regions and said drain regions having similar sizes and shapes.
8. A method in accordance with claim 7 wherein:
said wordline conductor is formed of doped polysilicon.
9. A method in accordance with claim 7 wherein:
said source region sidewalls are formed along the <100> crystal plane, and
said wordline conductor is formed of doped polysilicon.
10. A method in accordance with claim 7 wherein:
said semiconductor substrate comprises silicon.
11. A method in accordance with claim 7 wherein:
said semiconductor substrate comprises silicon,
said source region sidewalls are formed along the <100> crystal plane, and
said wordline conductor is formed of doped polysilicon.
12. A method in accordance with claim 7 wherein:
mesas are formed in said silicon substrate between said STI trench isolation regions,
said contacts being aligned with said mesas and isolated from a <110> silicon (Si) plane of said substrate,
thereby eliminating a possible cause of a leakage problem.

* * * * *